United States Patent [19]

Enzlin et al.

[11] 4,288,807
[45] Sep. 8, 1981

[54] DARLINGTON CIRCUIT HAVING AN IMPROVED DIODE DRAIN

[75] Inventors: Theodoor H. Enzlin, Eindhoven; Antonius J. Janssen, Nijmegen, both of Netherlands

[73] Assignee: U.S. Philips Corporation, New York, N.Y.

[21] Appl. No.: 24,750

[22] Filed: Mar. 28, 1979

[30] Foreign Application Priority Data

Apr. 7, 1978 [NL] Netherlands ................... 7803706

[51] Int. Cl.³ .......................................... H01L 27/02
[52] U.S. Cl. ..................... 357/46; 357/49; 357/55; 357/56; 357/86
[58] Field of Search ............... 357/46, 49, 55, 56, 357/86

[56] References Cited

U.S. PATENT DOCUMENTS 4,138,690 2/1979 Nawa et al. ........................ 357/46

OTHER PUBLICATIONS

IBM-Tech. Bul.-vol. 16, No. 6, Nov. 1973-pp. 1735-1736 Jones et al.

Primary Examiner—Edward J. Wojciechowicz
Attorney, Agent, or Firm—Thomas A. Briody; Robert T. Mayer; Steven R. Biren

[57] ABSTRACT

In a Darlington circuit with integrated speed-up diode the parasitic four-layer effect (p-n-p-n), which is detrimental to the circuit, is removed by giving the diode a divided configuration. The width of the sub-regions is chosen to be so small that the short-circuited p-n junction between the cathode of the diode and the base of the control transistor cannot or substantially can not be biased in the forward direction in the inner part of the semiconductor device.

9 Claims, 7 Drawing Figures

DARLINGTON CIRCUIT HAVING AN IMPROVED DIODE DRAIN

BACKGROUND OF THE INVENTION

The invention relates to a semiconductor device having a Darlington circuit comprising a semiconductor body having two transistors comprising emitter and collector regions of the first conductivity type and an intermediate base region of the second conductivity type, the emitter region of one of the transistors, hereinafter termed "first transistor", being connected to the base of the second transistor, a diode being provided between the base and the emitter of the first transistor, a surface region of the first conductivity type which forms a first zone of the diode and is connected to the base region of the first transistor being present in said base region, a second region of the diode which forms a rectifying contact with the first zone being connected to the emitter region of the first transistor.

The object of the diode is to provide a drain for charge stored in the base of the second transistor, so that a short switching-off time is obtained. Such circuits are used, for example, in switching supply units, as well as in circuits for line deflection in television receivers.

A semiconductor device as described above is disclosed in U.S. Pat. No. 3,913,213. In this case the diode is provided by disposing a second n-type region in the p-type base of the first transistor beside the n-type emitter and forming a p-type region in said n-type region. The n-type region is connected to the base of the first transistor by means of a metal layer, while the p-type region is connected to the emitter of this transistor and to the base of the second transistor.

Experiments with such Darlington circuits have demonstrated that said circuits often do not operate satisfactorily; notably during switching off very high currents may occur, with sufficient power to cause permanent damage to the device.

SUMMARY OF THE INVENTION

It is an object of the invention to provide a Darlington circuit having an integrated diode which can be operated at high powers and which does not exhibit parasitic current upon switching off.

The invention is based inter alia on the recognition that a cause of the high-current phenomena can be found in a parasitic four-layer structure effect. The invention is furthermore based on the recognition that said high-current effect can surprisingly be removed by giving the surface area of the first conductivity type a suitable geometry.

The p-n junction between the diode zones together with the p-n junction between the p-type region and the base of the first transistor and with the base collector junction of the first transistor constitutes a parasitic p-n-p-n structure (p-zone diode, n-zone diode, p-base zone, n-collector zone). When, as a result of the switching off of the Darlington circuit, the diode starts passing current, holes are injected from the p-type region into the n-type region which in principle are drained via the base contact which short-circuits the cathode of the diode and the base zone of the transistor. However, some of the charge carriers cross the n-type region towards the base region of the transistor below the anode of the diode and must be drained to the base contact, in this case the base-cathode short-circuit, through said base region below the n-type region (cathode). Dependent on the length of the current path below the n-type region, the value of the current and the resistivity of the base region, a potential across said current path is built up at which the voltage in the base region below the anode of the diode is higher than at the area of the base contact. As a result of said voltage drop, the potential between the p-type base and the n-type region may locally obtain such a forward voltage that a parasitic current starts travelling in the p-n-p-n structure and the parasitic transistor formed by the n-p-n part starts passing current. In practice it has been found that parasitic currents in the order of 1 ampere may occur.

A possible solution to this problem may result from the fact that the emitter efficiency of the parasitic p-n-p transistor formed by the diode and the base is strongly reduced, for example, by giving the n-type region a thickness which is many times larger than the diffusion length of the minority charge carriers. However, such a solution is usually not compatible with the requirements which are imposed upon the transistors of the Darlington circuit.

A Darlington circuit according to the invention is characterized in that the first zone comprises a number of juxtaposed sub-zones which each form a rectifying junction with parts of the second region of the diode and are separated from each other at least along a part of their circumference by parts of the base and along a substantial part of their circumference are connected to said parts of the base by a contact layer extending across the p-n junction between said sub-zones and the parts of the base.

By choosing the geometry of the sub-zones, notably those dimensions which determine the current path across which the potential is built up, in such manner that, given the maximum current through the sub-zone and the resistivity of the base zone said potential drop remains sufficiently small, the above-mentioned p-n-p-n effect can be avoided at higher powers, and also in the case of rapid switching of a Darlington circuit.

Since on the one hand the sub-zones of the first zone can be made so narrow that the resistance of the underlying parts of the base remains sufficiently low and on the other hand a sufficiently large number of zones can be chosen to sufficiently restrict the current through each of the sub-zones, the p-n junction between the base and a sub-zone is not biased in the forward direction.

A preferred embodiment of the invention is characterized in that said parts of the second region of the diode are formed by zones of the second conductivity type which are provided in the sub-zones of the first conductivity type and which form p-n junctions with the sub-zones of the first conductivity type.

The doping concentrations of the zones of the second conductivity type is preferably at most ten times higher than that of the surface region of the first conductivity type. The advantage of this is that the emitter efficiency of the parasitic transistor formed by the zones of the diode and the base of the transistor is restricted and hence also fewer charge carrier are injected in the base region of the parasitic transistor. This in turn reduces the number of charge carriers which can cross towards the base region of the transistor and thus the above-mentioned voltage drop.

The doping concentration of the sub-zones of the first conductivity type is preferably chosen to be comparatively high. For that purpose a preferred embodiment is characterized in that the doping concentration of said zones is at least equal to the doping concentration of the emitter regions of the transistors. An important preferred embodiment which has for its advantage that said zones of the diode can be provided entirely simultaneously with the emitter regions of the transistors and hence do not require extra process steps is characterized in that the thickness and the impurity concentration of the sub-zones of the first conductivity type are at least substantially equal to those of the emitters of the two transistors. It has been found that a favourable doping concentration is at most $7.10^{19}$ atoms/cm$^3$. A preferred embodiment is characterized in that said doping concentration is between approximately $5.10^{19}$ and approximately $7.10^{19}$ atoms/cm$^3$.

A further preferred embodiment of the semiconductor device is characterized in that the sub-zones are formed by a number of mutually substantially parallel and elongate strip-shaped zones which are juxtaposed and are connected to the base zone of the first transistor by a contact layer extending along substantially the whole length of said strip-shaped zones above the p-n junction between said zones and the base zone of the first transistor. The sub-zones may be united to form one assembly so that the surface region of the first conductivity type shows, for example, a comb structure or meandering structure, but other configurations are also possible.

BRIEF DESCRIPTION OF THE DRAWINGS

The invention will now be described in greater detail with reference to various embodiments and the drawing, in which.

DETAILED DESCRIPTION

Figure 1:
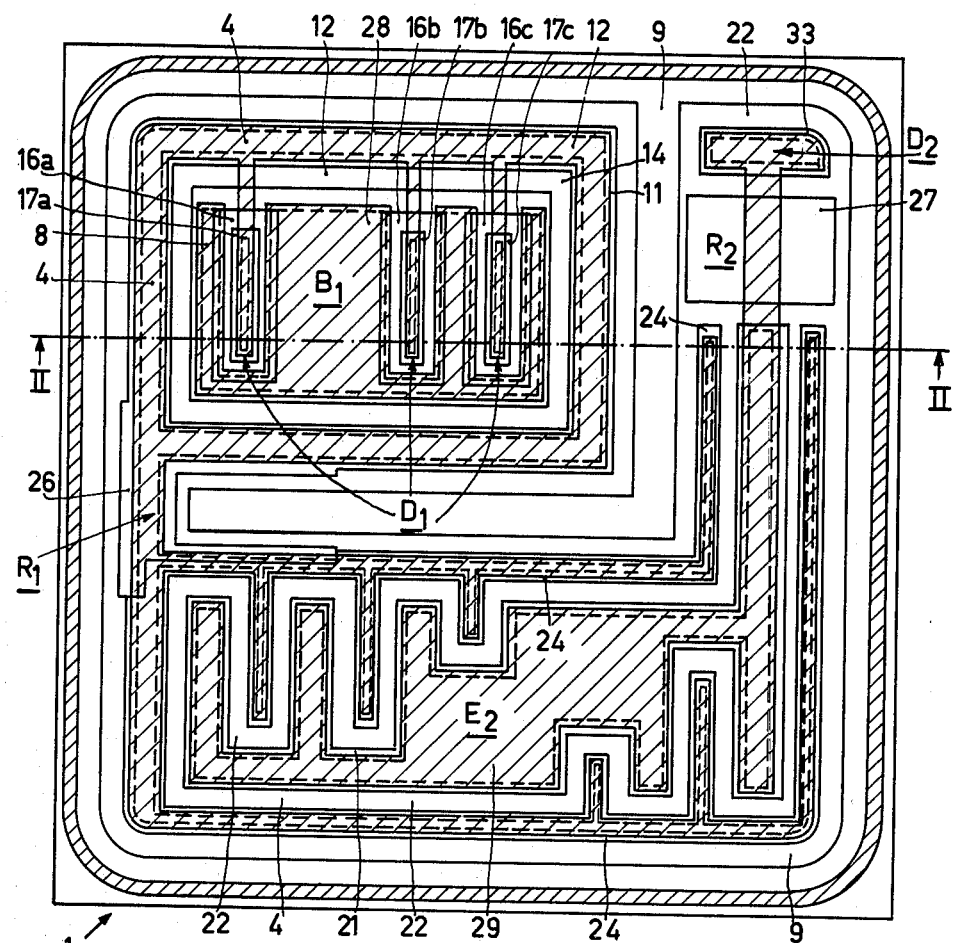
FIG. 1 is a diagrammatic plan view of a semiconductor device according to the invention.

The figures are diagrammatic and not drawn to scale in which, for clarity, particularly the dimensions in the direction of thickness are exaggerated in the cross-sectional views. Semiconductor zones of the same conductivity type are generally shaded in the same direction; corresponding parts in the Figures are generally referred to by the same reference numerals.

Figure 2:
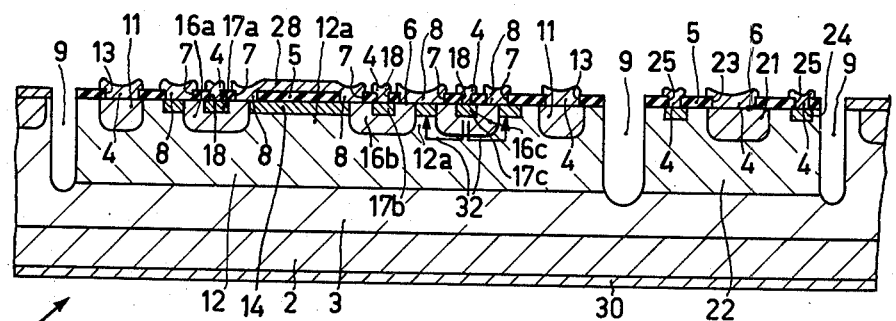
FIG. 2 is a diagrammatic cross-sectional view of the semiconductor device shown in FIG. 1 taken on the line II—II.
Figure 3:
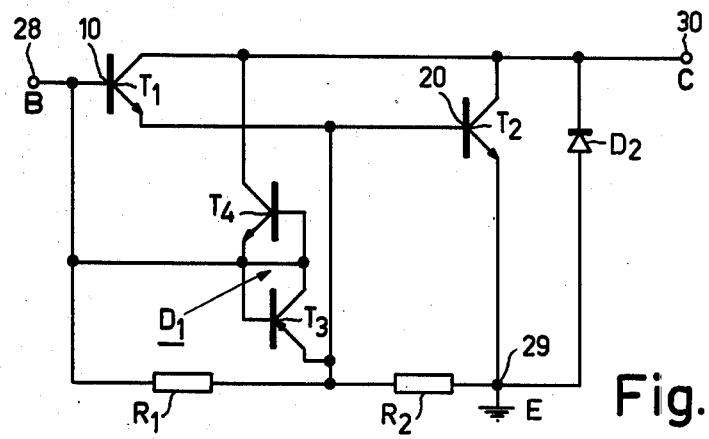
FIG. 3 shows the electric circuit diagram of the Darlington circuit as realized in FIG. 1.

The semiconductor device shown in FIGS. 1 and 2 comprises a so-called Darlington circuit of which FIG. 3 shows the electric equivalent circuit diagram. The device comprises a semiconductor body of a suitable semiconductor material, usually silicon, although other semiconductor materials may also be used advantageously. The circuit consists mainly of two transistors, namely a first transistor 10, a control transistor, with which the circuit can be switched, and a second transistor 20, the main transistor, of which the base is connected to the emitter of the first transistor 10 for supplying the base current.

The transistors 10, 20 comprise a common collector region 2, 3 of a first conductivity type, in this example the n-type, and consisting of a low-ohmic substrate part 2 and a part 3 which is formed thereon and has a lower doping concentration than the substrate 2. The part 3 may be formed, for example, by epitaxial growth. The region 2 has an electric contact layer 30 on its lower side.

The first transistor, the control transistor 10, comprises an n-type emitter region 11 and a p-type base region 12 situated between emitter and collector. The emitter is constructed as a closed path, approximately according to a rectangle as is shown in the plan view of FIG. 1.

The second transistor, the main transistor 20, comprises an n-type emitter region 21 and a p-type base region 22. The base regions 12 and 22 are separated for the greater part by a groove 9 extending from the surface of the semiconductor body through the base regions down to the collector region, except on the left-hand edge of FIG. 1, where the resistor $R_1$ is formed, which will be referred to hereinafter. The base region may also be formed by epitaxial growth on the high-ohmic collector part 3.

The emitter region 11 of the control transistor 10 and the base 22 are connected together by the conductive pattern 4, for example, of aluminium, shown shaded in FIG. 1, which is formed on the insulating layer 5, for example of silicon oxide, covering the surface and is connected, via contact windows 13 and 25, to the emitter region 11 and to a highly doped contact zone 24 provided in the base 22, respectively. It is to be noted that all contact windows in the plan view shown in FIG. 1 are shown in broken lines.

A diode is provided between the base and the emitter of the first transistor 10. As is known, such a diode serves to drain charge stored in the base of the main transistor during switching off, so that the switching-off time of the Darlington circuit is reduced. Said diode comprises an n-type surface region 16 which is provided in the base region 12 of the control transistor 10 and which forms a first zone of the diode, in this example the cathode, and is conductively connected to the base region 12. A second region of the diode, the anode, which forms a rectifying junction with the cathode 16 is conductively connected to the emitter region 11 of the control transistor and to the base region 22 of the main transistor. In the present example the anode is formed by a p-type zone 17, provided in the n-type region 16.

It has been found that in known devices of the kind described very large currents can occur during switching off, which may even cause fatal damage to the device. In order to prevent this disadvantage, according to the invention the first zone 16 comprises a number of juxtaposed sub-zones which for mutual distinction are provided with reference numerals 16a, 16b and 16c. Said sub-zones of the n-type conductivity each form a rectifying junction with parts of the second region of the diode, formed by p-type zones provided in each of the zones 16a, 16b and 16c and referred to by reference numerals 17a, 17b and 17c, respectively. The sub-zones 16a, 16b and 16c are separated from each other at least along a part of their circumference by parts 12a of the base 12 and are connected to said parts of the base along a substantial part of their circumference by a contact layer 8 which extends in the contact windows 7 above the p-n junction between said sub-zones and the parts of the base.

The effect of the invention will be described with reference to FIGS. 2 and 3. During switching off of the Darlington circuit, a low, preferably negative, potential is applied to the base of the control transistor 10. The transistor $T_1$ (10) extinguishes so that the main transistor 20 ($T_2$) no longer obtains base current. The charge stored in the base 22 of the main transistor 20 causes the transistor $T_2$ to remain temporarily conductive. This charge can be drained by $R_1$ and by the base-emitter junction of the control transistor 10 which is now cut off. The most important drain path is formed by the diode $D_1$ which becomes forward biased when the Darlington circuit is switched off. Holes are injected into the cathode 16 by the anode 17 of the diode. These holes will be drained for the greater part via the cathode. However, the diode forms a parasitic p-n-p transistor $T_3$ with the p-type base region 12, the collector of which transistor is connected to the base. A part of the injected holes reaches the collector of the p-n-p transistor and flows below the cathode of the diode to the short-circuit contact 8. As a result of this, a voltage can be built up below the cathode of the diode which in the known devices is sufficiently large to bias the p-n junction between the cathode of the diode and the base of the control transistor $T_1$ (10) in the forward direction. As a result of this the emitter-base junction of the parasitic transistor $T_4$, formed by the cathode of the diode, the base of the control transistor and the collector of the Darlington circuit is also biased in the forward direction. As a result of this, said transistor $T_4$ will pass current; experiments have demonstrated that in the known devices this current may become so high (approximately 1 Ampère) that the device is damaged permanently.

In a device according to the invention, the switching of the transistor $T_4$ is prevented by choosing the geometry of the n-region to be so that the voltage which is built up below the cathode remains sufficiently low to prevent switching of said transistor. The shape of the n-regions 16a, 16b and 16c has been chosen to be so that the resistance in the p-type base region 12 of the current paths 32 is sufficiently low to prevent the p-n junction between the cathode 16 of the diode and the p-type base 12 from being biased in the forward direction. The width of the zones 16 depends on a large number of parameters, inter alia the resistance of the base region 12 and current to be passed. In a practical case said width can simply be chosen by those skilled in the art in such manner as is desired in connection with the optimum operation of the device.

In this example the doping concentration of the p-regions 17 are at most ten times higher than those of the n-type regions 16. This comparatively small doping difference has for its result that the emitter efficiency of transistor $T_3$ is low so that the number of injected holes remains low. This holds the current in the p-type base 12 below the regions 16 to a very small value and hence reduces the possibility of switching of transistor $T_4$.

In this example the short-circuit 8 which extends across the p-n junction between the n-regions 16 and the parts of the base 12, also forms the base contact of transistor $T_1$.

In order to effect a good contact, the surface concentration of the base of transistor $T_1$ is increased at the area of said contact layer.

In this example the contact layer has such a shape that an external contact can be provided on it directly (base connection 28 in FIGS. 1, 3). This contact face is preferably situated as symmetrically as possible with respect to the emitter zone of transistor $T_1$.

The sub-zones 16a, 16b and 16c constitute a number of substantially parallel and elongate juxtaposed strip-shaped zones; this is a practical configuration both as regards the operation of the device and as regards the contact layer necessary for the various zones and regions. This contact layer has a comb shape, the projecting parts of which are parallel to said zones, and it connects said zones to the base zone 12. The p-type zones 17a, 17b and 17c which are situated in the strip-shaped zones 16a, 16b and 16c are also provided with a comb-like contact layer. Said comb shape is such that the projecting parts interdigitate with those of the first comb shape.

The Darlington circuit comprises two resistors $R_1$ and $R_2$, as is usual. The resistor $R_1$ which connects the base of $T_1$ to the base of $T_2$ is formed by a pinch resistor formed by a part of the p-type layer 12 which is bounded in the vertical direction by a part of the emitter 11 and the collector region 5 and in the horizontal direction by the groove 9. The resistor $R_2$ is also formed in the same manner by a pinch resistor consisting of a part of the p-type region 22 bounded in the vertical direction by the n-type region 27 and the collector region 3 and bounded in the horizontal direction by the groove 9. This resistor $R_2$ connects the intrinsic emitter-zone adjoining part of the base 22 to the highly doped p-type region 33.

The p-type region 22 in which the highly doped p-zone is situated constitutes a p-n junction with the n-type collector region 3 which junction may be used as a protecting diode denoted in FIG. 3 by $D_2$. As shown in the Figure, the emitter contact layer 29 has a number of fingers and a widened part which is suitable for providing an external connection.

The device can be manufactured entirely in a manner generally known to those skilled in the art.

In a specific embodiment the thickness of the p-type base regions 12, 22 is approximately 30 micrometers and the surface concentration is $5 \times 10^{18}$ atoms/cm$^3$.

The thickness and the doping concentration of the cathode 16 which was provided simultaneously with the emitter of the transistors 10, 20 are 10 micrometers and $6 \times 10^{19}$ atoms/cm$^3$, respectively.

The doping concentration of the anode 17 is $10^{20}$ at/cm$^3$, while the thickness of the anode is 2 micrometers.

It has been found that with these values good results can be obtained with a width for each n-type region 16 of 200 micrometers and a width for each p-type region 17 of 100 micrometers with a current through the diode of 2A.

Figure 4:
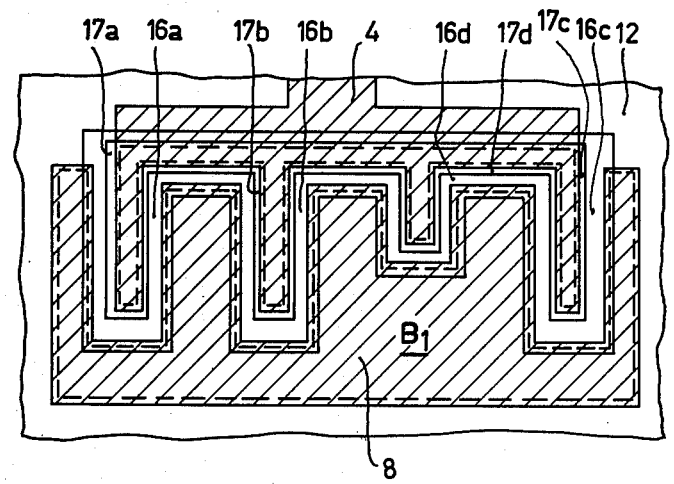
FIG. 4 is a diagrammatic plan view of the embodiment of a part of another semiconductor device in accordance with the invention.

FIG. 4 is a plan view of the diode 16, 17 according to a second embodiment of a Darlington circuit in accordance with the invention. The transistors 10 and 20 and the resistors $R_1$ and $R_2$ may be identical to the corresponding transistors and resistors according to the first embodiment and they are therefore not shown in FIG. 4. The sub-zones 16a, 16b and 16c in this embodiment are connected together by the part 16d to form a comb structure. The zones 17 are also connected to form a comb structure by the part 17d. The contact layer 8 short-circuits the region 16 along substantially its whole circumference with the base region 12 of transistor $T_1$.

Figure 5:
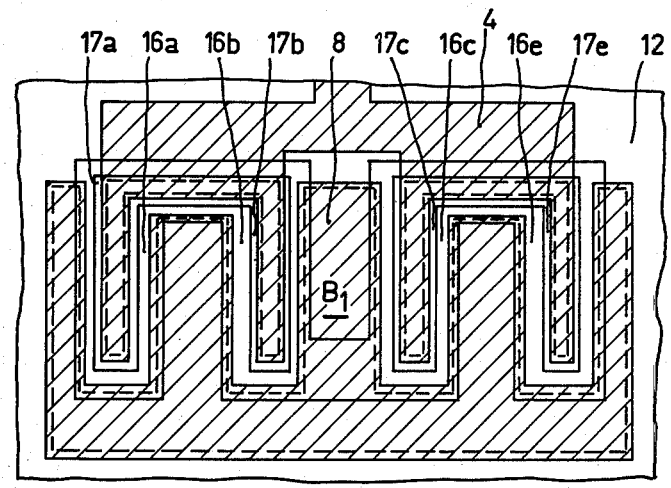
FIG. 5 is a diagrammatic plan view of a modified embodiment of the construction shown in FIG. 4.

FIG. 5 shows a further modified embodiment in which the regions 16a, 16b, 16c and 16e are connected to form a meandering structure which is short-circuited along a substantial part of its circumference with the base of transistor T₁ via a comb-shaped contact 8. The p-regions 17a, 17b and 17c, 17e, respectively, are united to form two U-shaped zones which are contacted via the comb-shaped contact layer 4.

Figure 6:
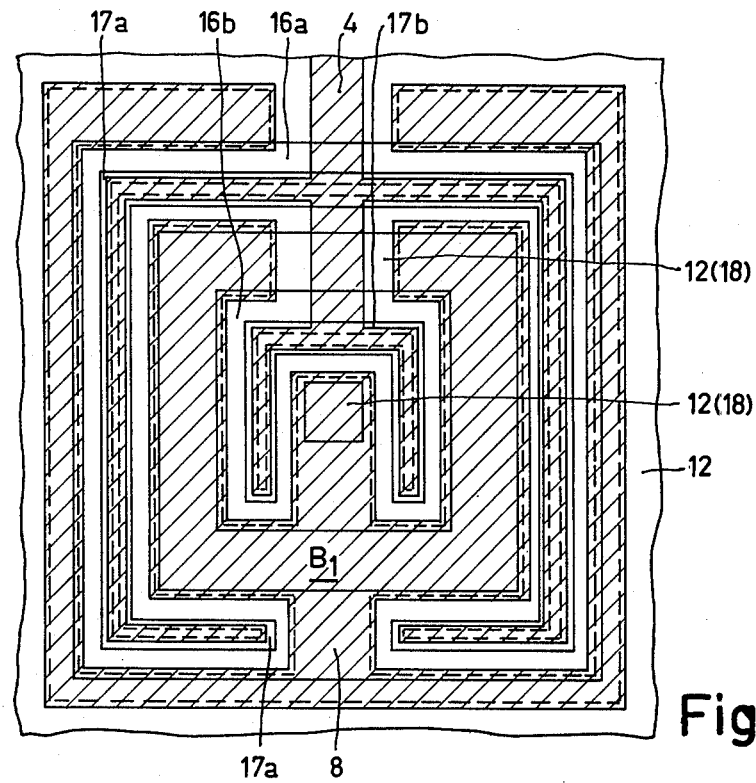
FIG. 6 is a diagrammatic plan view of yet another modified embodiment of the construction shown in FIG. 4.

FIG. 6 is a plan view of a further modified embodiment of the diode 16, 17 in which the regions 16a, 16b form closed strip-shaped zones. The p-type zones 17a, 17b in this example are again more or less U-shaped.

Figure 7:
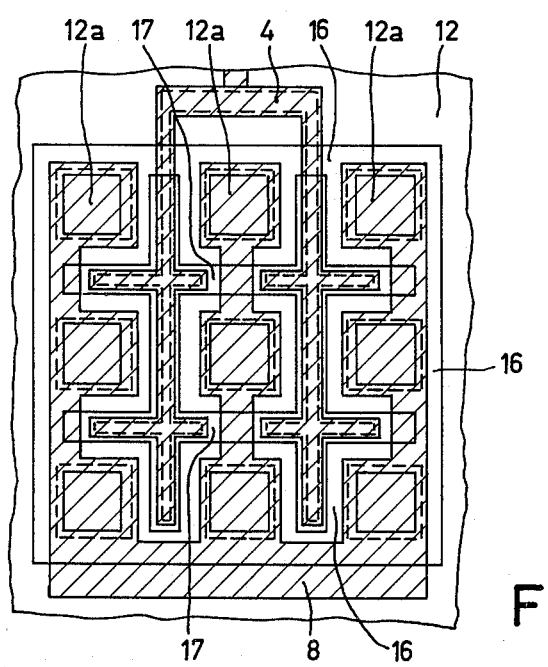
FIG. 7 is a diagrammatic plan view of yet another construction of a part of another semiconductor device in accordance with the invention.

FIG. 7 finally shows an embodiment in which the sub-zones of the cathode 16 are obtained from one coherent n-type region which has apertures in which the said intermediate parts of the base 12 adjoin the surface of the semiconductor body.

The zones 12a, which for purposes of making a good contact have an increased doping concentration, are provided so that the cathode 16 in plan view shows a grid-shaped pattern. The zones 17 are provided in the cathode 16 according to a second grid and are contacted by the contact layer 4 consisting of vertical strips having horizontal transverse parts. The short-circuit between the sub-zones of the cathode 16 and the sub-regions 12a is obtained by choosing the contact holes to be larger than the area of the sub-regions 12a. The contact 8 which is more or less comb-shaped short-circuits, as is shown in FIG. 7, the p-n junctions between the sub-zones and the adjoining parts of the cathode 16 along their whole circumference so that parasitic p-n-p-n action can again be prevented effectively, as described above.

It will be obvious that the invention is not restricted to the examples described but that many variations are possible to those skilled in the art without departing from the scope of this invention.

For example, the conductivity of all semiconductor zones and regions in the embodiments may (simultaneously) be replaced by their opposite types.

The contact layer 8 which effects the short-circuit between the regions 16 and the parts 12a of the base region need not necessarily be situated in a contact hole in which the p-n junction between said regions merges at the surface. This p-n junction may alternatively be covered, for example, by an insulating layer across which a metal track ensures the short-circuit via contact holes to said regions.

On the other hand, in FIG. 2, the insulating layer 5 between the regions 16a and 16b at the area of the connection contact 28 (B₁ in FIG. 3) may be omitted.

In the device shown in FIGS. 1 and 2 the groove 9 may be filled with silicon oxide or another insulating material, if so desired.

In addition, numerous other shapes possible in the design of the sub-regions of the cathode 16; the closed strip-shaped zones in FIG. 6, for example, may also be constructed as concentric circular zones; alternatively, the sub-zones may extend, for example, in the form of a star from a central part.

Finally, a circuit of the above-mentioned kind can be controlled again by a third transistor the emitter of which is connected to the base of the control transistor and the collector may be connected, if desired, to the common collector region of the Darlington circuit, in which this third transistor is provided with a similar diode as described above between the emitter and the base.

What is claimed is:

1. A semiconductor device having a Darlington amplifier circuit comprising:
    a semiconductor body having first and second bipolar transistors, each comprising an emitter and a collector region of a first conductivity type and an intermediate base region of a second conductivity type opposite to that of the first, the emitter region of said first transistor being connected to the base region of said second transistor;
    a diode provided between the base and the emitter regions of said first transistor;
    a surface region of said first conductivity type in the base region of the first transistor and electrically connected thereto, said surface region forming a first zone of said diode and said first zone comprising a plurality of juxtaposed sub-zones which are at least partially separated from each other by parts of the base region of the first transistor and are connected to said parts of the base region by a contact layer which extends across the p-n junction between said sub-zones and said parts of the base region;
    a second region of said second conductivity type in the surface region and forming a rectifying contact with said surface region, said second region forming a second zone of said diode, and said second zone comprising a plurality of sub-zones, a sub-zone of the second zone being located in each juxtaposed sub-zone of the first zone, and each sub-zone of the second zone being connected to the emitter region of said first transistor.

2. A semiconductor device as claimed in claim 1, characterized in that the doping concentration of the sub-zones of the second conductivity type is at most ten times higher than the doping concentration of the surface region of the first conductivity type.

3. A semiconductor device as claimed in claim 1, characterized in that the sub-zones of the first conductivity type are connected to said parts of the base region by means of a base contact extending across the p-n junction between said sub-zones and said parts of the base.

4. A semiconductor device as claimed in claim 3, characterized in that the surface doping concentration of the base of the first transistor is increased at least at the area of the contact layer.

5. A semiconductor device as claimed in claim 1, characterized in that the juxtaposed sub-zones are formed by a number of mutually substantially parallel and elongate juxtaposed strip-shaped zones which are connected to the base zone of the first transistor by a contact layer which extends along substantially the whole length of said strip-shaped zones above the p-n junction between said zones and the base zone of the first transistor.

6. A semiconductor device as claimed in claim 5, characterized in that said contact layer has a comb-shape in which the projecting parts are parallel to said elongate strip-shaped zones and connect same to the base zone of the first transistor, and that the zones of the second conductivity type provided in the sub-zones of the first conductivity type are also provided with a contact layer which forms a second comb-shaped structure, the projecting parts of which interdigitate with those of the first comb shape.

7. A device as claimed in claim 1, characterized in that the thickness and the impurity concentration of the sub-zones of the first conductivity type are at least substantially equal to those of the emitters of the two transistors.

8. A device as claimed in claim 1, characterized in that the doping concentration of the zone of the first conductivity type is at most approximately $7.10^{19}$ atoms/cm$^3$.

9. A device as claimed in claim 8, characterized in that the doping concentration of the zone of the first conductivity type is between approximately $5.10^{19}$ and approximately $7.10^{19}$ atoms/cm$^3$.

* * * * *